United States Patent
Harley et al.

(10) Patent No.: US 9,123,826 B1
(45) Date of Patent: Sep. 1, 2015

(54) SINGLE CRYSTAL SOURCE-DRAIN MERGED BY POLYCRYSTALLINE MATERIAL

(71) Applicant: International Business Machines Corporation, Armonk, NY (US)

(72) Inventors: Eric C. Harley, Lagrangeville, NY (US); Judson R. Holt, Wappingers Falls, NY (US); Yue Ke, Fishkill, NY (US); Rishikesh Krishnan, Painted Post, NY (US); Timothy J. McArdle, Hopewell Junction, NY (US); Alexander Reznicek, Troy, NY (US); Dominic J. Schepis, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/222,780

(22) Filed: Mar. 24, 2014

(51) Int. Cl.
*H01L 21/8234* (2006.01)
*H01L 27/092* (2006.01)

(52) U.S. Cl.
CPC .... *H01L 21/823431* (2013.01); *H01L 27/0924* (2013.01)

(58) Field of Classification Search
CPC .................. H01L 21/8232; H01L 29/66007
See application file for complete search history.

(56) References Cited

U.S. PATENT DOCUMENTS

| 7,309,626 | B2 | 12/2007 | Ieong et al. |
| 7,692,254 | B2 | 4/2010 | Anderson et al. |
| 8,362,574 | B2 | 1/2013 | Kawasaki et al. |
| 2013/0193446 | A1 | 8/2013 | Chao et al. |

*Primary Examiner* — Cheung Lee

(74) *Attorney, Agent, or Firm* — L. Jeffrey Kelly; Yuanmin Cai

(57) ABSTRACT

A method of forming a semiconductor structure includes forming a first fin and a second fin on a substrate. A gate structure is formed over a first portion of the first fin and the second fin without covering a second portion of the first fin and the second fin. Single-crystal epitaxial layers are deposited surrounding the second portion of the first fin and the second fin such that the single-crystal epitaxial layer on the first fin does not contact the single-crystal epitaxial layer on the second fin. A polycrystalline layer is then deposited surrounding the single-crystal epitaxial layers, so that the polycrystalline layer contacts the single-crystal epitaxial layer on the first fin and the single-crystal epitaxial layer on the second fin. The single-crystal epitaxial layers and the polycrystalline layer form a merged source-drain region.

20 Claims, 8 Drawing Sheets

SINGLE CRYSTAL SOURCE-DRAIN MERGED BY POLYCRYSTALLINE MATERIAL

BACKGROUND

The present invention generally relates to semiconductor devices and more particularly to fin field effect transistor devices (FinFET) having single-crystal source-drain regions merged by a polycrystalline material.

Complementary Metal-oxide-semiconductor (CMOS) technology is commonly used for fabricating field effect transistors (FET) as part of advanced integrated circuits (IC), such as CPUs, memory, storage devices, and the like. Most common among these may be metal-oxide-semiconductor field effect transistors (MOSFET), in which a gate structure may be energized to create an electric field in an underlying channel region of a substrate, by which charge carriers are allowed to travel through the channel region between a source region and a drain region of the substrate. As ICs continue to scale downward in size, fin field effect transistors (FinFETs), sometimes referred to as tri-gate structures, may be potential candidates for 32 nm node technology and beyond primarily because FinFETs may offer better performance than planar FETs at the same power budget. FinFETs are three dimensional (3D), fully depleted MOSFET devices having a fin structure formed from the substrate material. The gate structure may wrap a portion of the fin acting as the channel region. The portion of the fin not covered by the gate structure may define the source-drain region of the semiconductor device.

SUMMARY

The ability to manufacture FinFET devices including a polycrystalline material merging single-crystal source-drain regions may facilitate advancing the capabilities of current CMOS technology.

According to one embodiment of the present disclosure, a method of forming a semiconductor structure may include forming a first fin and a second fin on a substrate. A gate structure may be formed over a first portion of the first fin and the second fin without covering a second portion of the first fin and the second fin. Single-crystal epitaxial layers may be deposited surrounding the second portion of the first fin and the second fin such that the single-crystal epitaxial layer on the first fin does not contact the single-crystal epitaxial layer on the second fin. A polycrystalline layer may be deposited surrounding the single-crystal epitaxial layers, so that the polycrystalline layer contacts the single-crystal epitaxial layer on the first fin and the single-crystal epitaxial layer on the second fin thereby forming a merged source-drain region.

According to another embodiment, a semiconductor structure may include a first fin and a second fin on a substrate, a gate structure over a first portion of the first fin and the second fin, a second portion of the first fin and the second fin not covered by the gate structure, single-crystal epitaxial layers surrounding the second portion of the first fin and the second fin, the single-crystal epitaxial layer on the first fin does not contact the single-crystal epitaxial layer on the second fin, a polycrystalline layer surrounding the single-crystal epitaxial layers, so that the polycrystalline layer contacts the single-crystal epitaxial layer on the first fin and the single-crystal epitaxial layer on the second fin to form a merged source-drain region.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
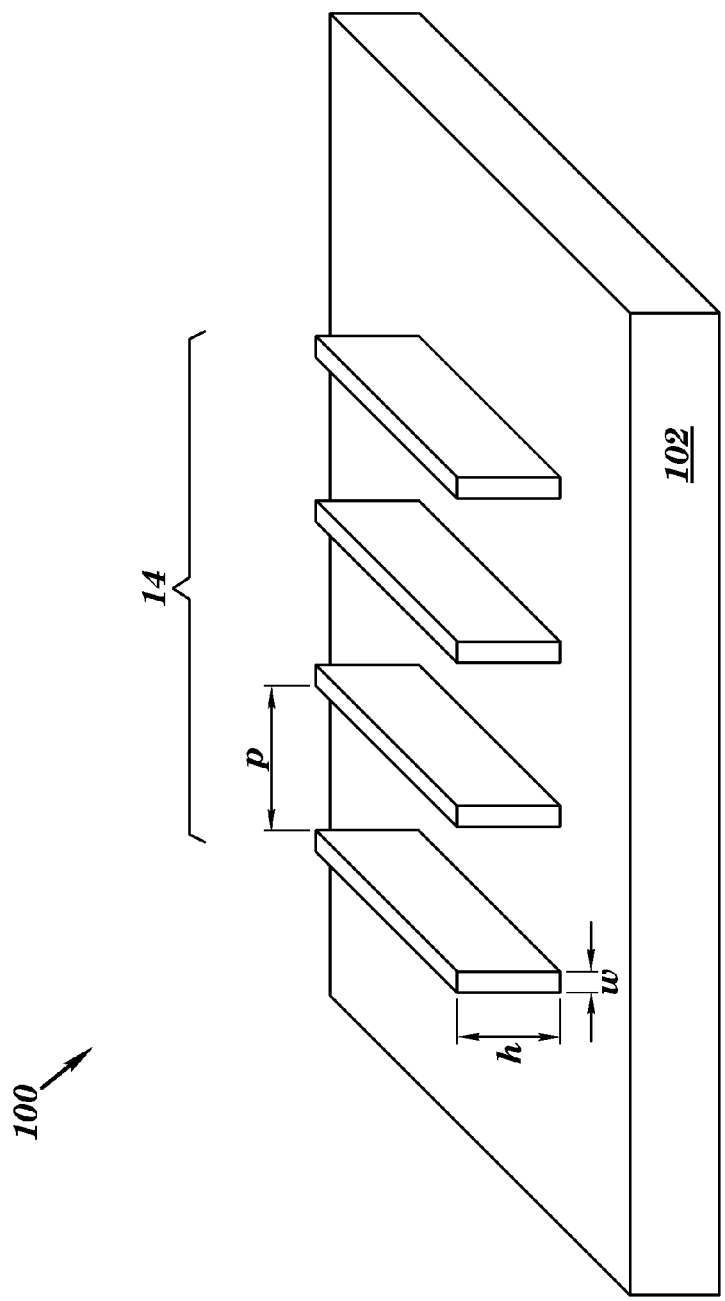
FIG. 1 is an isometric view of a semiconductor structure depicting the formation of a plurality of fins, according to an embodiment of the present disclosure.

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

FinFET devices may present an alternative to planar FET devices to allow increased scaling of semiconductor devices. However, FinFETs size and topography may pose numerous challenges to current CMOS manufacturing technology. Among those challenges may be the reduction of source-drain resistance without sacrificing device performance and process complexity. Source-drain resistance may be reduced by forming an epitaxial layer off the fin surface until the fin structures are merged. However, such a technique may present several limitations to the formation of merged source-drain regions including extended deposition time and selectivity loss during the epitaxial deposition process which may ultimately lead to reduced device performance and reliability. By forming a polycrystalline material surrounding single-crystal unmerged source-drain regions, embodiments of the present disclosure may, among other potential benefits, reduce deposition time, prevent selectivity loss during the deposition process and limit dopant diffusion to certain regions of the substrate.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Referring now to FIG. 1, a semiconductor structure 100 may be formed or provided. At this step of the manufacturing process, a plurality of fin structures 14 (hereinafter "fins") may be formed from a substrate 102 of the semiconductor structure 100. The substrate 102 may be, for example, a semiconductor-on-insulator (SOI) substrate, where a buried insulator layer (not shown) separates a base substrate (not shown) from a top semiconductor layer (not shown). The components of the semiconductor structure 100, including the fins 14, may then be formed in or adjacent to the top semiconductor layer. In other embodiments, the substrate 102 may be a bulk substrate which may be made from any of several known semiconductor materials such as, for example, silicon, germanium, silicon-germanium alloy, carbon-doped silicon, carbon-doped silicon-germanium alloy, and compound (e.g. III-V and II-VI) semiconductor materials. Non-limiting examples of compound semiconductor materials include gallium arsenide, indium arsenide, and indium phosphide.

The fins 14 may be formed by any method known in the art. In an exemplary embodiment, the fins 14 may be formed by a sidewall image transfer (SIT) technique. It should be noted that, while the embodiment depicted in FIG. 1 includes four fins 14, any number of fins may be formed from the substrate 102. In embodiments in which the fins 14 may be formed from a bulk semiconductor substrate, the fins 14 may be isolated from one another by regions of a dielectric material (not shown). In one exemplary embodiment, the fins 14 may have a height h ranging from approximately 5 nm to approximately 200 nm, a width w ranging from approximately 5 nm to approximately 50 nm and may be separated by a pitch p ranging from approximately 20 nm to 100 nm.

Figure 2:
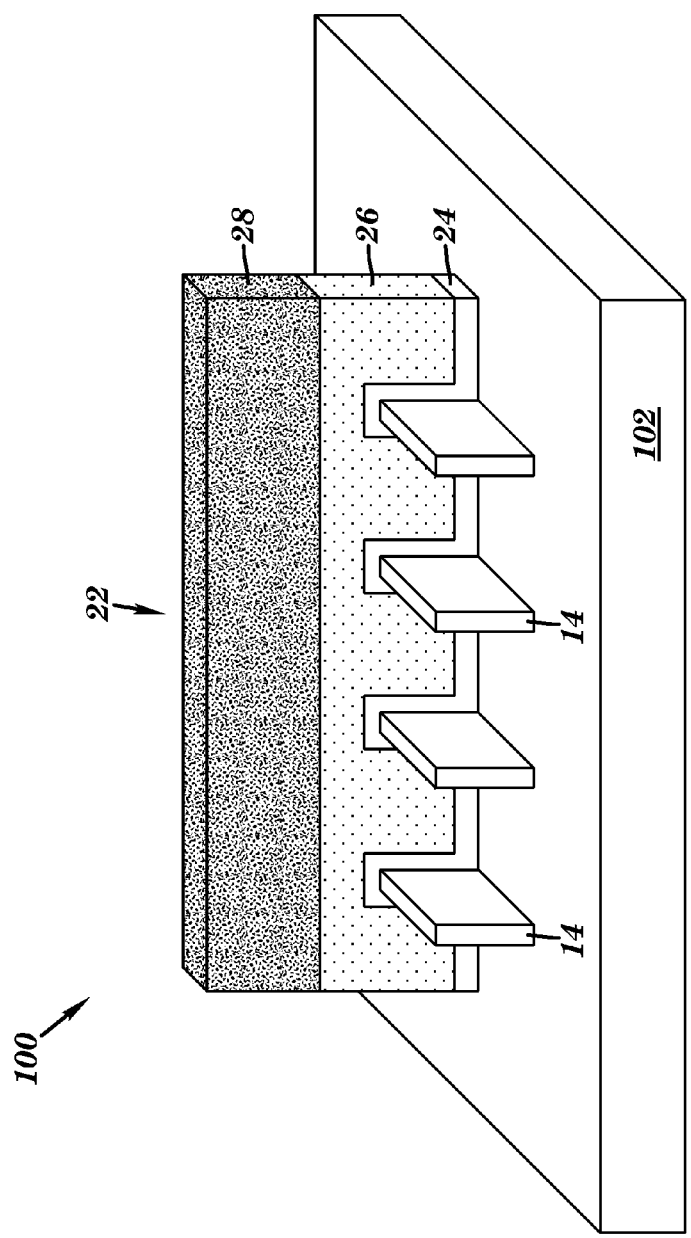
FIG. 2 is an isometric view of a semiconductor structure depicting the formation of a gate structure above the plurality of fins, according to an embodiment of the present disclosure.

Referring now to FIG. 2, a gate structure 22 may be formed over a portion of the fins 14 covering a channel region (not shown) of the semiconductor structure 100. It should be noted that the FinFET device may be fabricated using either a replacement metal gate (RMG) or gate last process flow, or a gate first process flow. For illustration purposes only, without intent of limitation, the embodiment described below uses a gate first process flow.

At this point of the manufacturing process, the gate structure 22 may include a gate dielectric 24, a gate electrode 26 and a gate cap 28. The gate dielectric 24 may include an insulating material including, but not limited to: oxide, nitride, oxynitride or silicate including metal silicates and nitrided metal silicates. In one embodiment, the gate dielectric 24 may include an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof. The gate dielectric 24 may be formed by any suitable deposition technique known in the art, such as, for example, chemical vapor deposition (CVD), plasma-assisted CVD, atomic layer deposition (ALD), evaporation, reactive sputtering, chemical solution deposition or other like deposition processes. The physical thickness of the gate dielectric 24 may vary, but typically may have a thickness ranging from about 0.5 nm to about 10 nm. More preferably the gate dielectric 24 may have a thickness ranging from about 0.5 nm to about 3 nm.

The gate electrode 26 may be formed on top of the gate dielectric 24. The gate electrode 26 may include, for example, Zr, W, Ta, Hf, Ti, Al, Ru, Pa, metal oxide, metal carbide, metal nitride, transition metal aluminides (e.g. $Ti_3Al$, ZrAl), TaC, TiC, TaMgC), and any combination of those materials. In one embodiment, the gate electrode 26 may include tungsten (W). The gate electrode 26 may be deposited by any suitable technique known in the art, for example by ALD, CVD, physical vapor deposition (PVD), molecular beam deposition (MBD), pulsed laser deposition (PLD), or liquid source misted chemical deposition (LSMCD). Furthermore, the gate cap 28 may be formed on top of the gate electrode 26 using any suitable deposition technique known in the art. The gate cap 28 may include but is not limited to, for example, silicon oxide, silicon nitride, silicon oxynitride, boron nitride, or any suitable combination of those materials.

Figure 3:
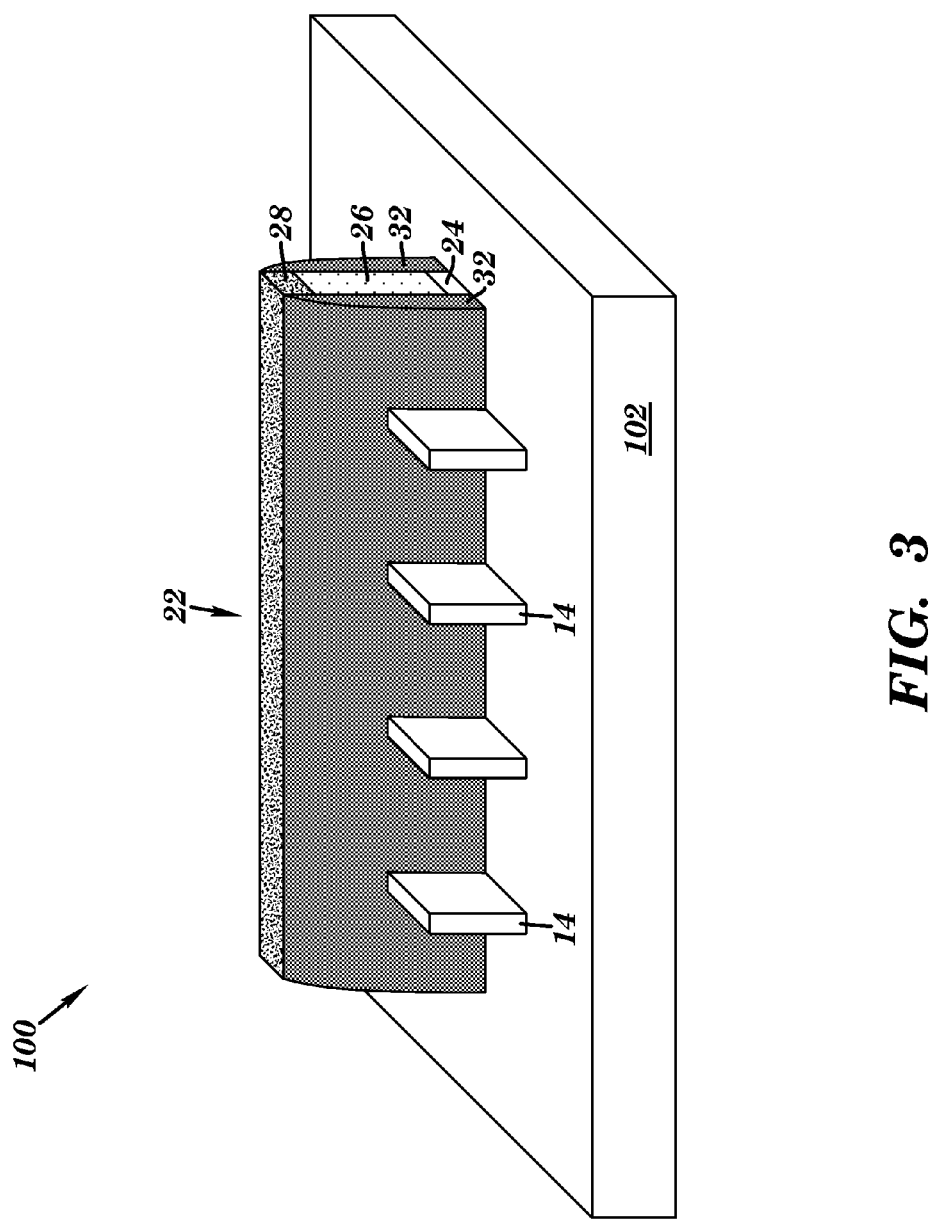
FIG. 3 is an isometric view of a semiconductor structure depicting the formation of gate spacers, according to an embodiment of the present disclosure.

Referring now to FIG. 3, gate spacers 32 may be formed on opposite sidewalls of the gate structure 22. The gate spacers 32 may be made from an insulator material such as an oxide, nitride, oxynitride, silicon carbon oxynitride, silicon boron oxynitride, low-k dielectric, or any combination thereof. In one embodiment, the gate spacers 32 may be made from a nitride and may be formed by conventional deposition and etching techniques. Further, in various embodiments, the gate spacers 32 may include one or more layers. While the gate spacers 32 are herein described in the plural, the gate spacers 32 may consist of a single spacer surrounding the gate structure 22.

Figure 4:
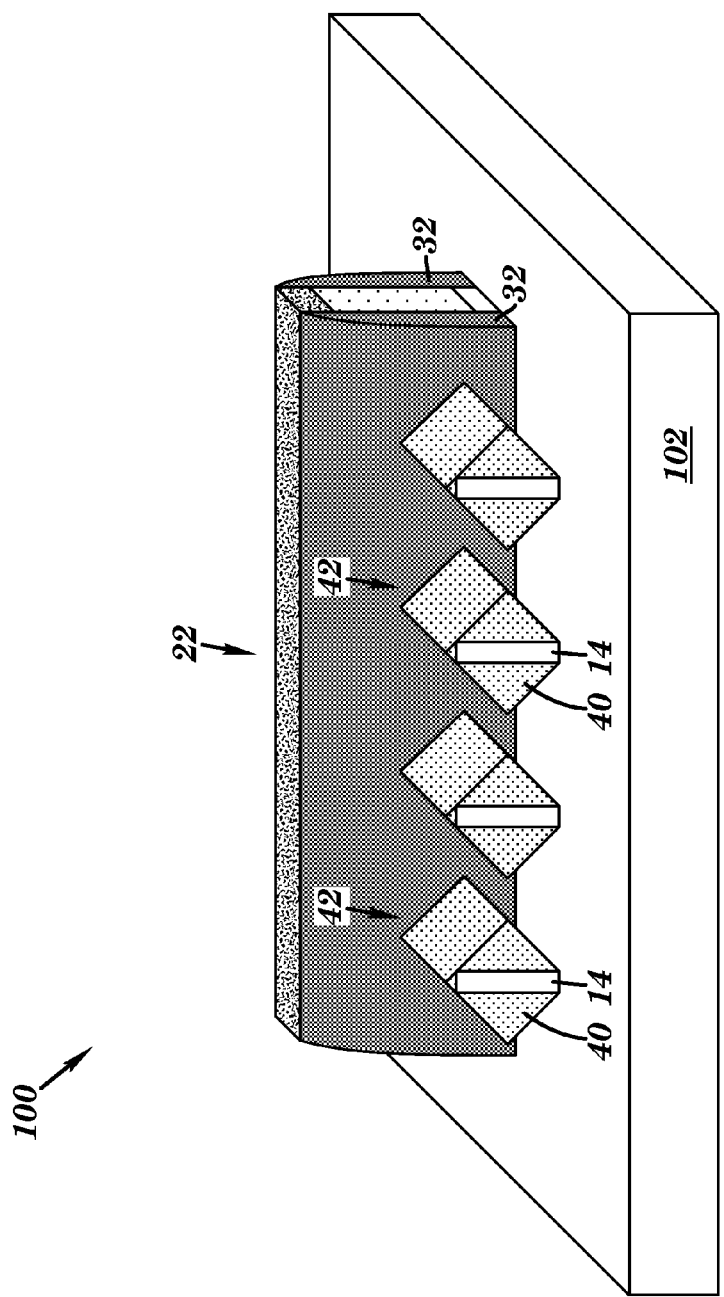
FIG. 4 is an isometric view of a semiconductor structure depicting the formation of unmerged source-drain regions, according to an embodiment of the present disclosure.

Referring now to FIG. 4, epitaxial layers 40 may be formed on exposed portions of the fins 14. The exposed portions of the fins 14 may consist of regions of the fins 14 not covered by the gate structure 22 (FIG. 3). The epitaxial layers 40 may include a single-crystal or monocrystalline material epitaxially grown on the fins 14. Growth of the epitaxial layers 40 may include forming the epitaxial layers 40 on the exposed portions of the fins 14 such that the epitaxial layers 40 surrounding one of the fins 14 does not contact the epitaxial layers 40 surrounding an adjacent fin 14 thereby forming single-crystal unmerged source-drain regions 42 (hereinafter "unmerged source-drain regions") as part of the semiconductor structure 100. In the depicted embodiment, the diamond shape observed in the unmerged source-drain regions 42 may be a consequence of the different growth rates during the epitaxial deposition process inherent to each crystallographic orientation plane of the single-crystal material forming the epitaxial layers 40. In other embodiments, the unmerged source-drain regions 42 may have a shape other than the diamond shape depicted in FIG. 4.

The terms "epitaxial growth and/or deposition" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

The epitaxial layers 40 may include any suitable single-crystal semiconductor material doped in-situ according to the characteristic of the semiconductor structure 100.

For example, in one embodiment where the semiconductor structure 100 is an n-type field effect transistor (n-FET) device, the epitaxial layers 40 may include a single-crystal carbon-doped silicon (Si:C) material, where the atomic concentration of carbon (C) may range from about 0.2-3.0%. The epitaxial layers 40 may be doped by any known n-type dopant use in the fabrication of an n-FET device, such as, for instance, phosphorus or arsenic. In one embodiment, the dopant concentration in the epitaxial layers 40 may range from approximately $4 \times 10^{20}$ cm$^{-3}$ to approximately $9 \times 10^{20}$ cm$^{-3}$.

For example, in another embodiment where the semiconductor structure 100 is a p-type field effect transistor (p-FET) device, the epitaxial layers 40 may include a single-crystal silicon-germanium (SiGe) material, where the atomic concentration of germanium (Ge) may range from approximately 10% to approximately 80%. In another embodiment, the concentration of germanium (Ge) may range from approximately 25% to approximately 50%. The epitaxial layers 40 may be doped by any known p-type dopant use in the fabrication of a p-FET device, such as, for instance, boron. In one embodiment, the dopant concentration in the epitaxial layers 40 may range from approximately $4 \times 10^{20}$ cm$^{-3}$ to approximately $9 \times 10^{20}$ cm$^{-3}$.

Examples of various epitaxial growth process apparatuses that may be suitable for use in forming the epitaxial layers 40 may include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE).

Figure 5:
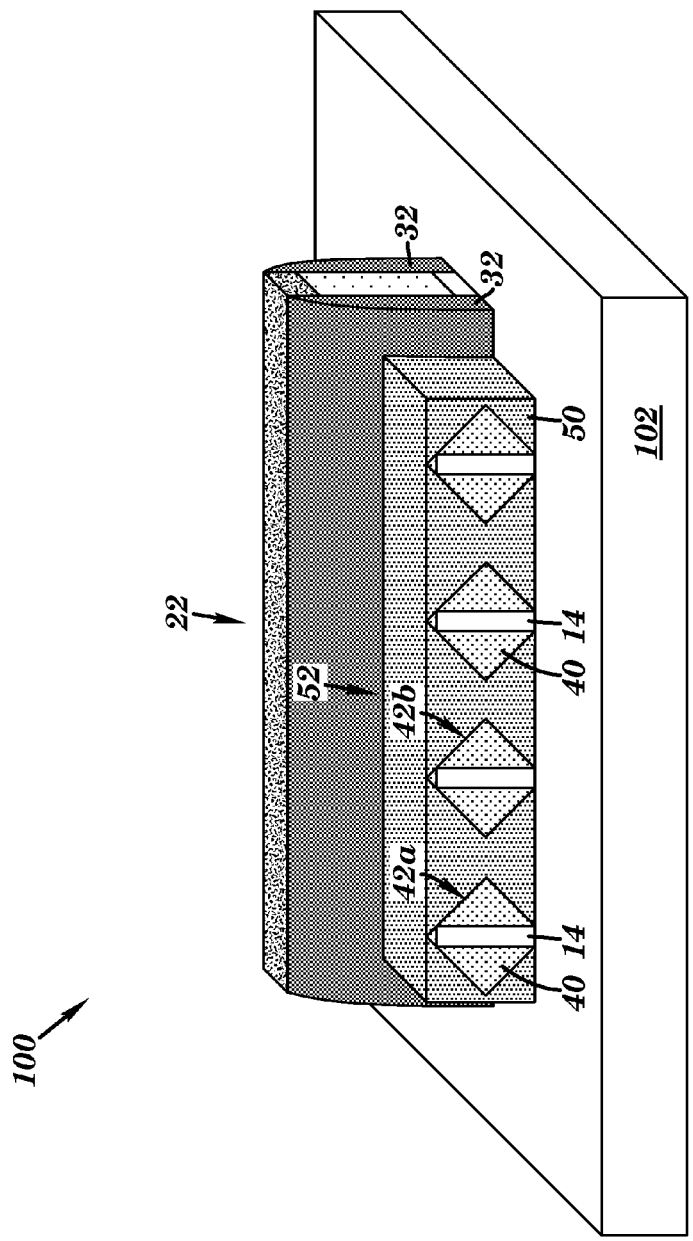
FIG. 5 is an isometric view of a semiconductor structure depicting the formation of a merged source-drain region, according to an embodiment of the present disclosure.
Figure 8:
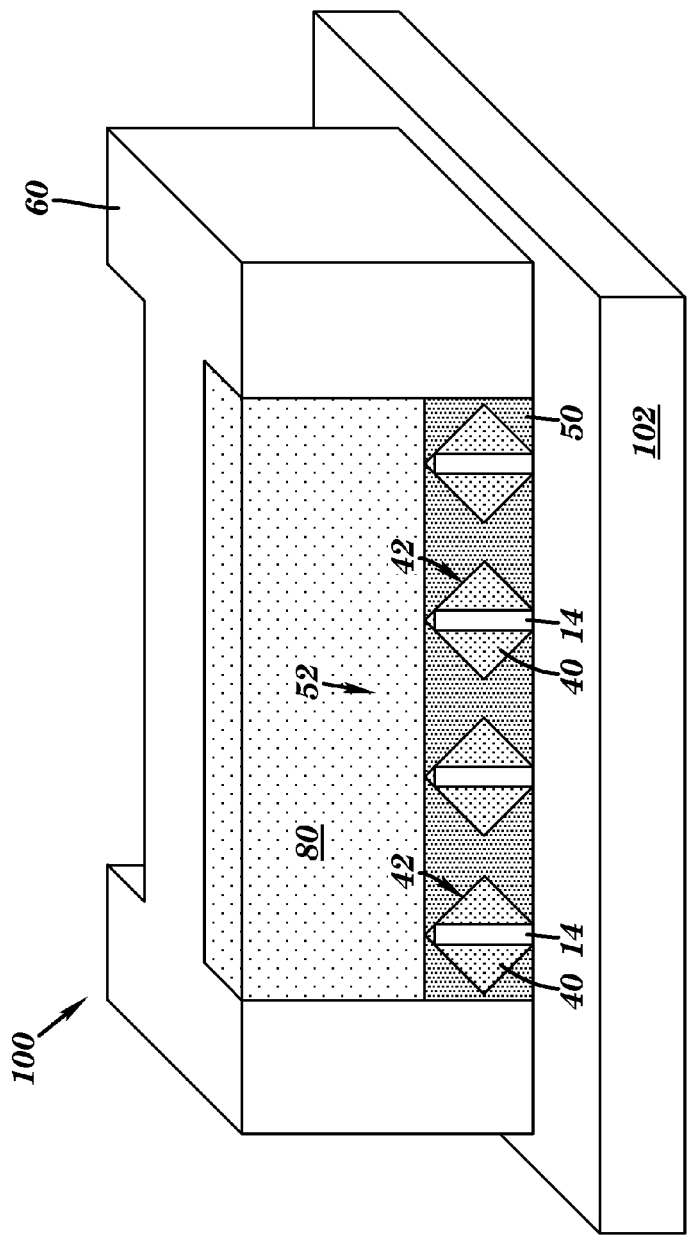
FIG. 8 is a cross-sectional view of a semiconductor structure depicting the formation of a contact metal, according to an embodiment of the present disclosure.

Referring now to FIG. 5, a polycrystalline layer 50 may be formed on the epitaxial layers 40. Formation of the polycrystalline layer 50 may include depositing a multi-grain polycrystalline material surrounding the epitaxial layers 40 until the polycrystalline layer 50 may combine the unmerged source-drain regions 42 (FIG. 4) forming a merged structure 52 (hereinafter "merged source-drain region") as part of the semiconductor structure 100. The deposition of the polycrystalline layer 50 may occur until the polycrystalline layer 50 surrounding one unmerged source-drain region 42a may contact the polycrystalline layer 50 surrounding an adjacent unmerged source-drain region 42b. The polycrystalline material forming the polycrystalline layer 50 may exhibit various crystal planes that may allow for growth in different directions during the deposition process thereby forming a merged source-drain region 52 with a substantially even surface. The ability to form a merged source-drain region 52 with a substantially even surface may provide a smooth landing region to a subsequently formed contact metal 80 (FIG. 8).

Owing to the different crystallographic directions in which the deposition process of the polycrystalline layer 50 may take place, formation of the merged source-drain region 52 may occur in a substantially faster rate than growing a single-crystal epitaxial layer off the fins 14 until the epitaxial layer has merged the fins 14.

The polycrystalline layer 50 may include any suitable polycrystalline semiconductor material doped in-situ according to the characteristic of the semiconductor structure 100.

For example, in one embodiment where the semiconductor structure 100 is an n-FET device, the polycrystalline layer 50 may include a polycrystalline silicon material. The polycrystalline layer 50 may be doped by any known n-type dopant use in the fabrication of an n-FET device, such as, for instance, phosphorus or arsenic. In one embodiment, the dopant concentration may range from approximately $5 \times 10^{20}$ cm$^{-3}$ to approximately $2 \times 10^{21}$ cm$^{-3}$.

For example, in another embodiment where the semiconductor structure 100 is a p-FET device, the polycrystalline layer 50 may include a polycrystalline silicon-germanium (SiGe) material, where the atomic concentration of germanium (Ge) may range from about 10% to about 80%. In another embodiment, the concentration of germanium (Ge) may range from about 25% to about 50%. The polycrystalline layer 50 may be doped by any known p-type dopant use in the fabrication of a p-FET device, such as, for example, boron. In one embodiment, the dopant concentration may range from approximately $5 \times 10^{20}$ cm$^{-3}$ to approximately $2 \times 10^{21}$ cm$^{-3}$. In other embodiments the polycrystalline layer 50 may also include a boron doped polycrystalline silicon material.

In an exemplary embodiment, the polycrystalline layer 50 may have a higher dopant concentration than the epitaxial layers 40 which may provide a lower dopant concentration near the fins 14 and a higher dopant concentration in close proximity to a subsequently formed contact metal (FIG. 8). The lower doping level in the epitaxial layers 40 may decrease dopant diffusion to an extension region (not shown) of the channel region (not shown) enfolded by the gate structure 22, more specifically, dopant diffusion may be reduced in an area of the substrate located under the gate spacers 32 thereby preventing a potential electrical short in the semiconductor structure 100.

The polycrystalline layer 50 may be formed by any suitable deposition technique known in the art, including atomic layer deposition (ALD), chemical vapor deposition (CVD), physical vapor deposition (PVD), molecular beam deposition (MBD), pulsed laser deposition (PLD), or liquid source misted chemical deposition (LSMCD).

Figure 6:
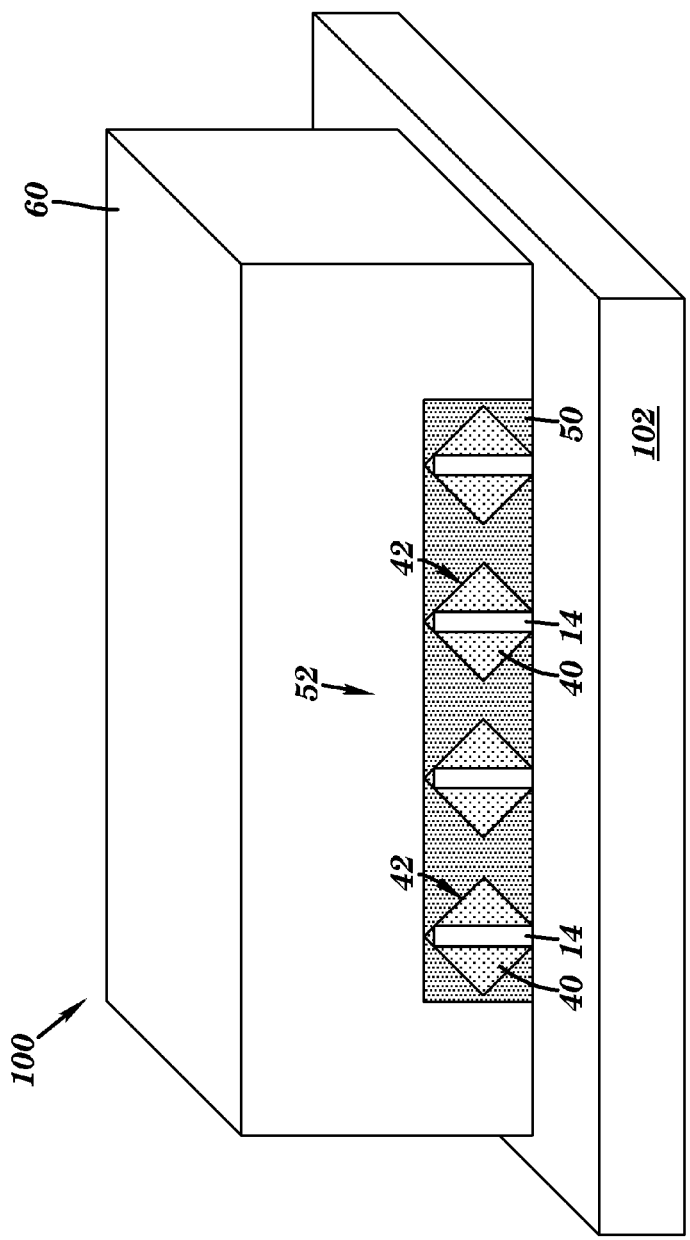
FIG. 6 is an isometric view of a semiconductor structure depicting the formation of an interlevel dielectric (ILD) layer, according to an embodiment of the present disclosure.

Referring now to FIG. 6, an interlayer dielectric (ILD) layer 60 may be formed above the substrate 102. The ILD layer 60 may cover the gate structure 22 and the merged source-drain region 52. Further, the ILD layer 60 may fill gaps between other existing devices within the semiconductor structure 100. While the ILD is shown to not fully cover the merged source-drain region 52 or the substrate 102 in FIG. 6, the end of the merged source-drain region 52 may be exposed only for illustrative clarity. The ILD layer 60 may include any suitable dielectric material, for example, silicon oxide, silicon nitride, hydrogenated silicon carbon oxide, silicon based low-k dielectrics, flowable oxides, porous dielectrics, or organic dielectrics including porous organic dielectrics and may be formed by any suitable deposition method known in the art, for example, by chemical vapor deposition (CVD) of a dielectric material.

Figure 7:
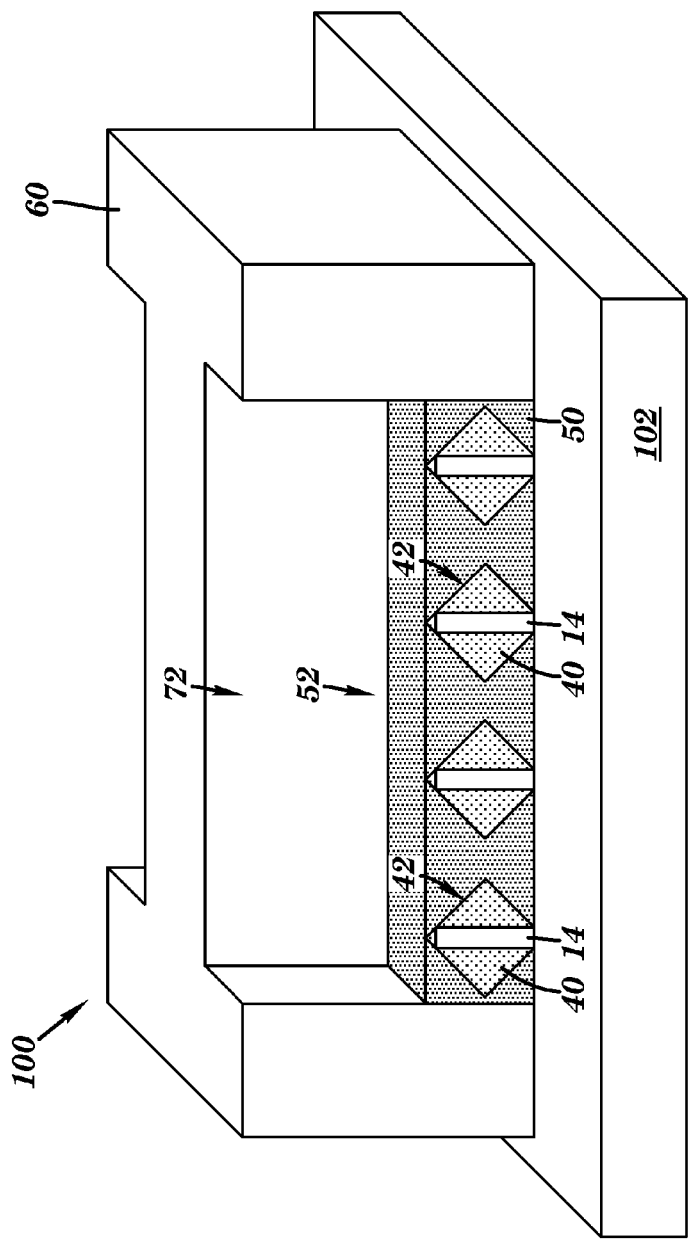
FIG. 7 is an isometric view of a semiconductor structure depicting the formation of a contact hole, according to an embodiment of the present disclosure.

Referring now to FIG. 7, a contact hole 72 may be formed in the ILD layer 60 to expose the merged source-drain region 52. The contact hole 72 may be formed by any photolithographic patterning process including, for example an anisotropic etching process such as reactive ion etching (RIE) or plasma etching.

Referring now to FIG. 8, a contact metal 80 may be deposited within the contact hole 72 (FIG. 7). The contact metal 80 may include any suitable metal or conductive metal compound. The contact metal 80 may be formed by several metal layers (not shown) of different materials. In one exemplary embodiment the contact metal 80 may include multiple layers including a titanium (Ti) liner, a titanium nitride (TiN) liner and a tungsten (W) layer. The contact metal 80 may be formed by any deposition method, including but not limited to ALD, CVD and plating. The polycrystalline layer 50 forming the merged source-drain region 52 may provide an even landing surface with a high dopant concentration to the contact metal 80.

Therefore, forming a polycrystalline layer 50 including a multi-grain polycrystalline material that combines single-crystal unmerged epitaxial layers 40 may decrease deposition times during formation of the merged source-drain region 52, which may prevent non-selective nodule formation. Further, the epitaxial layers 40 and the polycrystalline layer 50 may allow tunable dopant concentration, which may help constrain dopant diffusion under the gate spacers 32 (FIG. 5) to avoid possible electric shorts in the device thus enhancing device performance and increasing product yield and reliability, and the polycrystalline material forming the polycrystalline layer 50 may allow multi-directional growth which may result in a substantially even surface for contact landing.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method of forming a semiconductor structure, the method comprising:
    forming a first fin and a second fin on a substrate;
    forming a gate structure over a first portion of the first fin and the second fin, the gate structure not covering a second portion of the first fin and the second fin;
    depositing single-crystal epitaxial layers surrounding the second portion of the first fin and the second fin, wherein the single-crystal epitaxial layer on the first fin does not contact the single-crystal epitaxial layer on the second fin; and
    depositing a polycrystalline layer surrounding the single-crystal epitaxial layers, so that the polycrystalline layer contacts the single-crystal epitaxial layer on the first fin and the single-crystal epitaxial layer on the second fin;
    wherein the single-crystal epitaxial layers and the polycrystalline layer comprise a merged source-drain region.

2. The method of claim 1, wherein depositing the polycrystalline layer comprises growing a polycrystalline material.

3. The method of claim 2, wherein growth of the polycrystalline material occurs in different crystallographic planes.

4. The method of claim 3, wherein the growth of the polycrystalline material in different crystallographic planes causes the merged source-drain region to have a substantially even surface that provides a smooth landing region to a contact metal.

5. The method of claim 1, wherein depositing the polycrystalline layer comprises a faster deposition rate.

6. The method of claim 1, wherein depositing the polycrystalline layer comprises depositing an in-situ doped polycrystalline material such as silicon, silicon-germanium, or carbon-doped silicon.

7. The method of claim 6, wherein the in-situ doped polycrystalline material has a dopant concentration ranging from approximately $5 \times 10^{20}$ cm$^{-3}$ to approximately $2 \times 10^{21}$ cm$^{-3}$.

8. The method of claim 7, wherein the dopant concentration of the polycrystalline layer is substantially higher than a dopant concentration of the single-crystal epitaxial layer.

9. The method of claim 8, wherein the higher dopant concentration of the polycrystalline layer is in close proximity to a contact metal.

10. The method of claim 1, wherein depositing the single-crystal epitaxial layer comprises epitaxially growing an in-situ doped single-crystal material such as silicon, silicon-germanium, or carbon-doped silicon.

11. The method of claim 10, wherein the in-situ doped single-crystal material has a dopant concentration ranging from approximately $4 \times 10^{20}$ cm$^{-3}$ to approximately $9 \times 10^{20}$ cm$^{-3}$.

12. The method of claim 11, wherein a lower dopant concentration in the single-crystal epitaxial layer reduces dopant diffusion to an extension region of a channel region covered by the gate structure.

13. The method of claim 1, further comprising:
    forming an interlevel dielectric (ILD) layer above the substrate, the ILD layer covering the gate structure and the merged source-drain region;
    etching the ILD layer to form a contact hole, wherein the contact hole exposes the merged source-drain region; and
    depositing a contact metal in the contact hole.

14. A semiconductor structure, the structure comprising:
    a first fin and a second fin on a substrate;
    a gate structure over a first portion of the first fin and the second fin, the gate structure not covering a second portion of the first fin and the second fin;
    single-crystal epitaxial layers surrounding the second portion of the first fin and the second fin, wherein the single-crystal epitaxial layer on the first fin does not contact the single-crystal epitaxial layer on the second fin; and
    a polycrystalline layer surrounding the single crystal epitaxial layers, so that the polycrystalline layer contacts the single-crystal epitaxial layer on the first fin and the single-crystal epitaxial layer on the second fin;
    wherein the single-crystal epitaxial layers and the polycrystalline layer comprise a merged source-drain region.

15. The semiconductor structure of claim 14, further comprising:
    an interlevel dielectric (ILD) layer above the substrate, the ILD layer covering the gate structure; and
    a contact metal layer above the merged source-drain region surrounded by the ILD layer.

16. The semiconductor structure of claim 14, wherein the single-crystal epitaxial layer is an in-situ doped single-crystal material.

17. The semiconductor structure of claim 14, wherein the polycrystalline layer is an in-situ doped polycrystalline material.

18. The semiconductor structure of claim 14, wherein the polycrystalline layer has a dopant concentration that is substantially higher than a dopant concentration of the single-crystal epitaxial layer.

19. The semiconductor structure of claim 18, wherein the substantially higher dopant concentration in the polycrystalline layer is in close proximity to the contact metal.

20. The semiconductor structure of claim 18, wherein a lower dopant concentration in the single-crystal epitaxial layer reduces dopant diffusion to an extension region of a channel region covered by the gate structure.

\* \* \* \* \*